US010184807B2

(12) United States Patent
Motz et al.

(10) Patent No.: US 10,184,807 B2
(45) Date of Patent: Jan. 22, 2019

(54) TRUE-POWER-ON AND DIAGNOSTIC-CAPABLE INCREMENTAL INTERFACE FOR ANGULAR SENSORS

(71) Applicant: Infineon Technologies AG, Neubiberg (DE)

(72) Inventors: Mario Motz, Wernberg (AT); Wolfgang Scherr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 142 days.

(21) Appl. No.: 15/276,356

(22) Filed: Sep. 26, 2016

(65) Prior Publication Data

US 2018/0087930 A1    Mar. 29, 2018

(51) Int. Cl.
  *G01D 5/245*       (2006.01)
  *G01R 31/28*       (2006.01)

(52) U.S. Cl.
  CPC ......... *G01D 5/2454* (2013.01); *G01D 5/2457* (2013.01); *G01R 31/2884* (2013.01)

(58) Field of Classification Search
  CPC .. G01D 5/2454; G01D 5/2451; G01D 5/2455; G01D 5/2457; G01D 5/2458
  See application file for complete search history.

(56) References Cited

U.S. PATENT DOCUMENTS

| 5,686,804 | A | * | 11/1997 | Siraky | ............ | G01D 5/2455 |
|   |   |   |   |   |   | 318/592 |
| 6,097,318 | A | * | 8/2000 | Hagl | ............ | G01D 5/24404 |
|   |   |   |   |   |   | 341/116 |
| 2009/0015423 | A1 | * | 1/2009 | Wagner | ............ | G03G 15/50 |
|   |   |   |   |   |   | 340/679 |
| 2010/0057396 | A1 | * | 3/2010 | Oblizajek | ............ | G01D 5/2457 |
|   |   |   |   |   |   | 702/147 |

OTHER PUBLICATIONS

"Angle Sensor GMR-Based Angle Sensor." TLE5012B, User's Manual, V 1.0, Apr. 2014 User's Manual. Infineon. 101 pages.

* cited by examiner

*Primary Examiner* — Walter L Lindsay, Jr.
*Assistant Examiner* — Milton Gonzalez
(74) *Attorney, Agent, or Firm* — Eschweiler & Potashnik, LLC

(57) ABSTRACT

The current disclosure relates to an angular sensor. The angular sensor includes a sensing module, a digital processor and an incremental interface. The sensing module is configured to generate a sensing signal containing measurements of rotation activities of a rotating physical entity. The digital processor is configured to process and store the sensing signal. The incremental interface is coupled to the digital processor and includes an incremental pulse generator and a status data encoder. The incremental pulse generator is configured to convert and transmit the sensing signal as incremental square pulses through a unidirectional signal line, which are processed to generate rotary angle and direction of the physical entity. The status data encoder is configured to convert and transmit the sensing signal as a reference pulse and a status signal through a bidirectional signal line, which can be to request an absolute angle position or other sensor data.

25 Claims, 9 Drawing Sheets

TRUE-POWER-ON AND DIAGNOSTIC-CAPABLE INCREMENTAL INTERFACE FOR ANGULAR SENSORS

FIELD

The present disclosure is in the field of angular sensors, particularly, angular sensors for converting an angular displacement to a digital signal and processing and transmitting the digital signal using an incremental interface.

BACKGROUND

An angular sensor is a kind of sensor that provides rotary speed and position measurements by converting angular displacements to electrical signals. Angular sensors can be found in wide array of automotive and industrial applications such as steering wheel position sensing, pedal position sensing, and motor-shaft position sensing.

A commonly known interface used for data communications of the angular sensor is an incremental interface. This kind of interface is widely used due to its low cost, high speed transmission with rather low frequency signals, and ability to provide signals that can be easily decoded to provide motion related information such as rotary speed and rotary direction. It is also compatible to optical sensors. The incremental interface may include three unidirectional channels, known as A, B, Z channels. Signal lines A and B provide phase shifted pulses indicating rotary speed and rotary direction. Channel Z provides an index pulse indicating a reference point such as a zero-crossing point of the rotation. Counting of the pulses from the Signal lines A and B is reset once the index pulse from the channel Z is received. Thus, an absolute rotary position can be determined. However, a disadvantage of this incremental interface is that it is not 'true-power-on'. The absolute rotary position can only be received after the index pulse is received, i.e., the rotation passes the zero-crossing point. The absolute rotary position information may be delayed as the sensor may power on from a rotary position away from the zero-crossing point.

DETAILED DESCRIPTION

Figure 1:
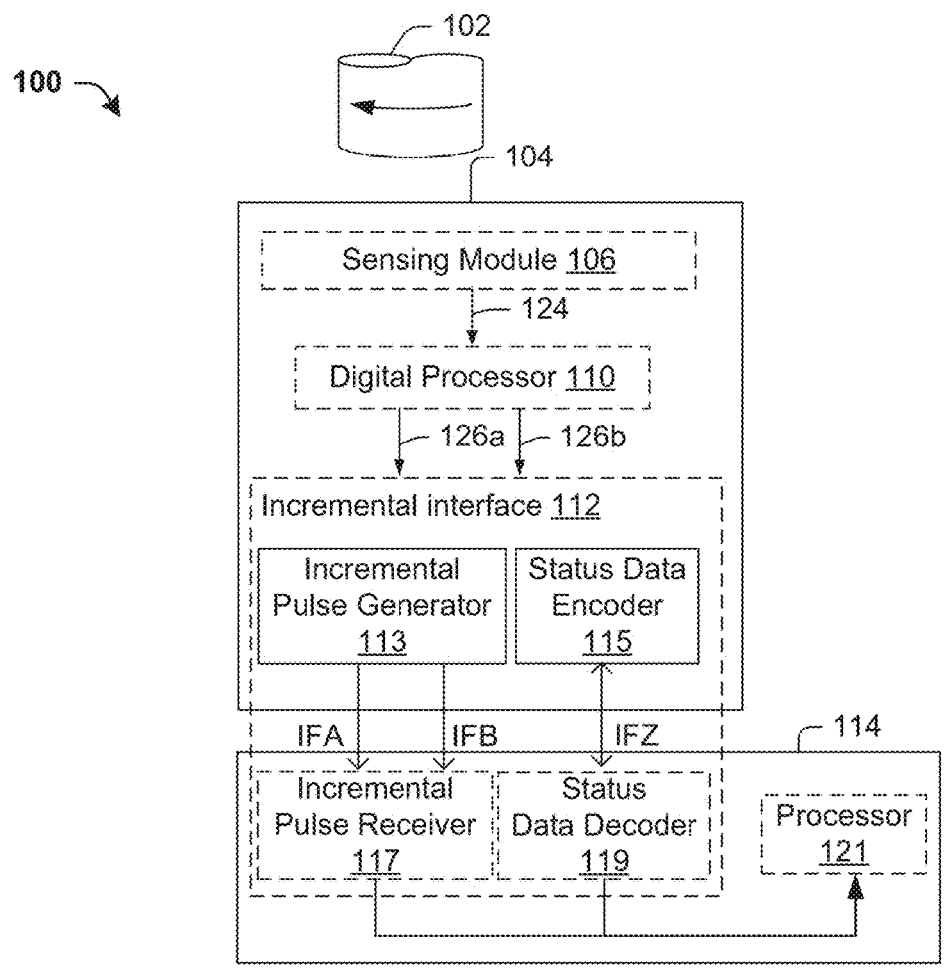
FIG. 1 shows a block diagram illustrating an angular sensor system including a true-power-on incremental interface for angular sensors according to some embodiments.

The present disclosure will now be described with reference to the attached drawing figures, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. For example, although the embodiments are described below with respect to some example protocols, the invention may also find utility in other communication protocols.

In previous incremental angular sensor systems, a sensing signal have been transmitted through three unidirectional lines, known as A, B, Z lines. A line and B line transmitted incremental pulses indicating relative rotary steps and direction, and Z line transmitted zero-crossing pulse upon which counting of the incremental pulses is reset, such that an absolute position of the sensor is acquired after receiving the zero-crossing pulse. In the current disclosure, systems and methods are disclosed that replace the previous unidirectional Z line with a new bidirectional Z line. This new bidirectional Z line enables absolute position and/or sensor status request and transmission in addition to the zero-crossing pulse transmission. Therefore, without requiring additional signal lines, real time absolute position detection and/or additional diagnostic functionality can be realized. Further, in some embodiments, the incremental A line and B line can be replaced by one single line, such that a more compact interface (two signal lines only) is realized.

In some embodiments, the angular sensor system comprises a sensing module configured to generate a sensing signal containing measurements of rotation activities of a rotating physical entity or conditions of the angular sensor. A digital processor is coupled to the sensing module and is configured to process and store the sensing signal. An incremental interface is coupled to the digital processor and configured to convert and transmit incremental signals through a first unidirectional signal line and a second unidirectional signal line, and receive a request signal and transmit an angular position signal and/or a status signal together with a zero-crossing pulse through a bidirectional signal line. A controller may be coupled to the incremental interface through the first and second unidirectional signal lines and the bidirectional signal line to send the request signal and to receive and process the incremental signals and the angular position signal to generate an absolute rotary angle signal, and/or to receive and process the status signal. By transmitting the zero-crossing pulse, the angular position signal and/or a status signal through one single bidirectional signal line, a compact true-power-on and diagnostic-capable incremental interface can be realized.

FIG. 1 shows a block diagram illustrating an angular sensor system 100 including a true-power-on incremental interface for angular sensors according to some embodiments. As shown in FIG. 1, the angular sensor system 100 comprises a rotatable physical entity 102, an angular sensor 104 configured to detect rotation of the physical entity 102, and a controller 114 configured to receive signals from the angular sensor 104. In some embodiments, the angular sensor 104 comprises a sensing module 106 configured to generate a sensing signal 124 containing measurements of rotation activities of the physical entity 102 or conditions of the angular sensor 104. The sensing signal 124 provides information about the motion of the physical entity 102, which is further processed into information such as speed, distance and position. For example, the sensing module 106 may comprise one or more magnetic field sensors to measure or sense magnetic fields resulting from permanent magnets attached to the physical entity 102. The sensing module 106 may also comprise a temperature sensor or a stress sensor to measure temperature or stress of the angular sensor system 100. A digital processor 110 is coupled to the sensing module 106 and configured to process and store the sensing signal 124. For example, the digital processor 110 may process the measured magnetic fields to generate an angular position signal 126a containing an absolute rotary position information of the physical entity 102. The absolute rotary position information can be then stored in a memory unit within the angular sensor 104 (not shown). The measured temperature and stress can also be stored in the memory unit as a sensor condition signal 126b.

The angular sensor 104 further comprises an incremental interface 112 coupled to the digital processor 110. The incremental interface 112 is configured to transmit and receive sensing signals between the angular sensor 104 and the controller 114 through transmission channels (e.g., signal lines). On one side of the transmission channels, the angular sensor 104 comprises an incremental pulse generator 113 and a status data encoder 115. The incremental pulse generator 113 is configured to convert and transmit the sensing signal as incremental square pulses through a pair of unidirectional signal lines IFA, IFB, which can manifest as separate wires. The status data encoder 115 is configured to convert and transmit a binary status signal and a zero-crossing pulse through a bidirectional signal line IFZ, which can a separate wire form IFA, IFB. On the other side of the transmission channels, the controller 114 comprises an incremental pulse receiver 117 and a status data decoder 119. The incremental pulse receiver 117 receives incremental square pulses and decodes these pulses to generate an incremental signal including rotary angle and rotary direction information of the physical entity 102. The status data decoder 119 receives the binary status signal and decodes it to generate an angular position signal and/or a sensor condition signal. In some embodiments, the incremental signal and the angular position signal are fed into a processor 121 of the controller 114 to generate an absolute rotary angle signal prior to receiving the zero-crossing pulse. Thereby, the absolute rotary angle is acquired by the controller 114 upon turning on of the angular sensor system 100, or within a very short time (angular position signal request and transmission time). Also, the sensor condition signal (e.g. temperature or stress) may be processed by the controller 114 to diagnose working conditions of the angular sensor 104.

Figure 2:
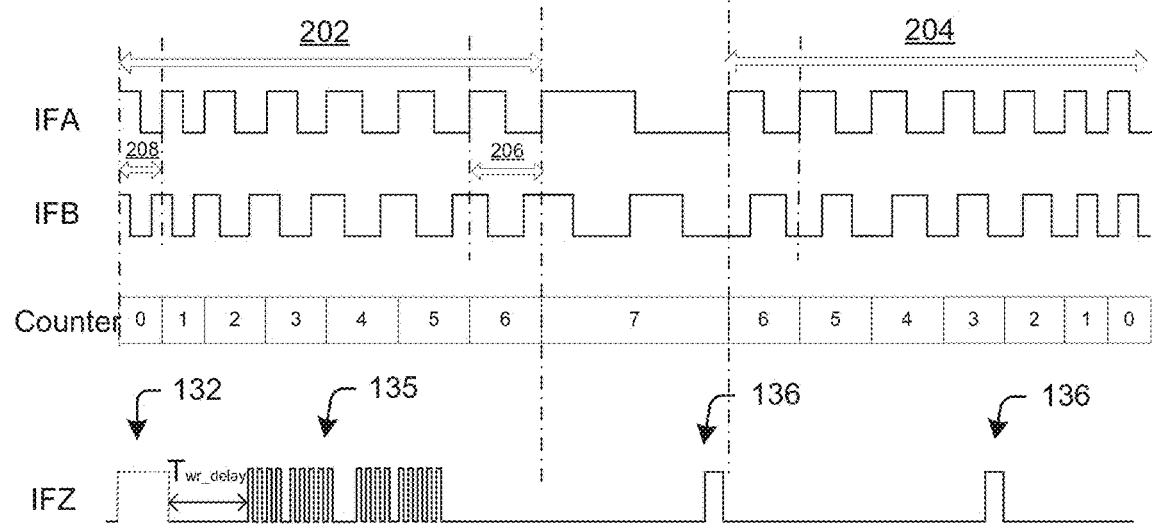
FIG. 2 shows a data transmission waveform diagram of a true-power-on incremental interface for angular sensors according to some embodiments.

With reference to FIG. 1, FIG. 2 shows a data transmission waveform diagram 200 of the incremental interface 112 for the angular sensor system 100 of FIG. 1 according to some embodiments. In some embodiments, the pair of unidirectional signal lines IFA, IFB transmits identical square wave signals from the angular sensor 104 to the controller 114 that correlate to the "pulse count" of the incremental interface. Each of the pulses is counted (by a counter) in the controller 114 and interpreted as one rotary angle unit. For example, if the incremental interface 112 has a resolution of 5,000 counts, there will be 5,000 pulses per revolution (PPR) on the signal line IFA, and 5,000 PPR on the signal line IFB. Each of the pulse received may mean a 360°×1/5000 rotary angle displacement. For interpretation purpose, FIG. 2 shows an example situation where the physical entity 102 to be measured rotates at a first direction with a decreasing speed during time 202 and then turns over to rotate at a second direction opposite to the first direction with an increasing speed during time 204. The pulse width increases as the rotary speed decreases. For example, during time 206, the physical entity 102 rotates more slowly while during time 208 the physical entity 102 rotates more quickly. The signal lines A and B offset from each other by a 90° phase shift to indicate a direction of the rotation. In one direction (e.g. the first direction) the leading edge of the pulses of the signal line IFA will be before the leading edge of the pulses of the signal line IFB, as shown in first half of the waveform during time 202. And in the opposite direction (e.g. the second direction) the signal line IFB will lead the signal line IFA, as shown in the second half of the waveform during time 204.

The bidirectional signal line IFZ transmits a request signal 132 from the controller 114 to the angular sensor 104. Upon receiving the request signal 132, which can exhibit a pre-determined waveform shape (e.g. pulses with a pre-determined pattern or pulse width) known to the incremental interface 112, a status signal 135 is transmitted from the angular sensor 104 to the controller 114. In some embodiments, the status signal 135 is encoded as a multi-bit binary signal. The status signal 135 may be an angular position signal or a sensor condition signal, corresponding to the request signal 132. The bidirectional signal line IFZ also transmits a zero-crossing pulse 136 indicating the physical entity 102 (see FIG. 1) crosses over a predetermined 'zero degree' rotary angle. In some embodiments, the zero-crossing pulse 136 is a single pulse with a predetermined pulse width as shown in FIG. 2. In some alternative embodiments, the zero-crossing pulse 136 comprises a series of pulses or has a pulse width varying according to a rotary speed. In some embodiments, the bidirectional signal line IFZ transmits and receives signals according to any standard digital communication protocol employing, but not restricted to, short pulse width modulation code (SPC), universal asynchronous receiver/transmitter (UART), peripheral sensor interface (PSI), with additional control lines employing serial peripheral interface (SPI) and inter-integrated circuit interface (I2C) and distributed systems interface (DSI) for data encoding. Beside above voltage pulse coded protocols, other embodiments also can use frequency modulated, amplitude modulated and phase modulated transmission of encoded data by the use of electrical voltages or currents on the physical connection.

It is appreciated that though the incremental interface 112 is drawn within the angular sensor 104 and coupled to the controller 114 in FIG. 1, the incremental interface 112 may be used for other communication systems includes a first transceiver and a second transceiver configured to exchange data with each other. The incremental interface 112 may be used in parallel with other communication interfaces according to varies communication protocols or alone. Examples of such a communication protocol include the single edge nibble transmission (SENT) protocol, the short pulse width modulation (PWM) code (SPC) protocol, and derivatives of the SENT or SPC protocol. The communication system can be used for any application. However, the communication system is typically used for automotive applications. In such embodiments, the first transceiver can, for example, be integrated with a sensor device (e.g. the angular sensor 104 of FIG. 1) and the second transceiver can, for example, be integrated with an electronic control unit (ECU) (e.g. the controller 114 of FIG. 1). Automotive applications for which the communication system finds particular use include, for example, steering wheel position sensing, pedal position sensing, and motor-shaft position sensing.

Figure 3:
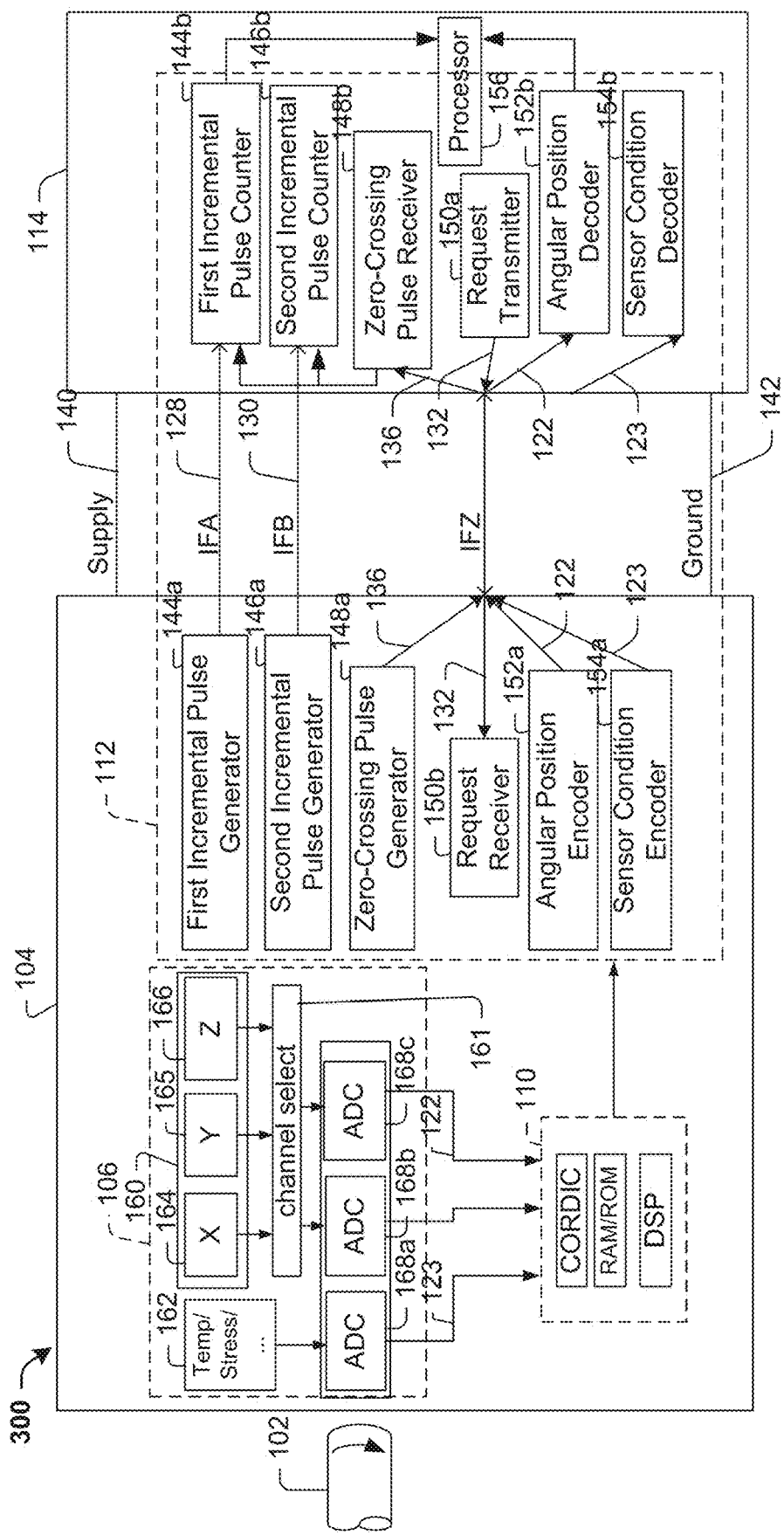
FIG. 3 shows a more detailed block diagram illustrating an angular sensor system including a true-power-on incremental interface for angular sensors according to some embodiments.

FIG. 3 shows a more detailed block diagram illustrating an angular sensor system 300 including a true-power-on incremental interface for angular sensors according to some embodiments. As shown in FIG. 3, the angular sensor system 300 comprises a rotatable physical entity 102, an angular sensor 104 configured to detect rotation of the physical entity 102, and a controller 114 configured to receive signals from the angular sensor 104. An incremental interface 112 including three signal lines IFA, IFB and IFZ, a power supply line 140, and a power return line 142 extend between the angular sensor 104 and the controller 114. The power lines 140, 142 are connected to power connectors and are employed to convey power from a power supply, such as a voltage source, integrated with or otherwise associated with the angular sensor 104 or the controller 114. A first signal line IFA is connected to a first incremental pulse generator 144a of the angular sensor 104 and a first incremental pulse counter 144b of the controller 114, and is configured to transmit a first plurality of incremental square pulses 128 from the first incremental pulse generator 144a to the first incremental pulse counter 144b. A second signal line IFB is connected to a second incremental pulse generator 146a of the angular sensor 104 and a second incremental pulse counter 146b of the controller 114, and is configured to transmit a second plurality of incremental square pulses 130 from the second incremental pulse generator 146a to the second incremental pulse counter 146b. A third signal line IFZ is connected between a plurality of transceiver pairs, including a zero-crossing pulse generator 148a of the angular sensor 104 and a zero-crossing pulse receiver 148b of the controller 114, and is configured to transmit a reference pulse, such as a zero-crossing pulse 136, to set a counter to a reference value, such as to reset the first and second incremental pulse counters 144b, 146b. The third signal line IFZ is also connected between a request transmitter 150a of the controller 114 and a request receiver 150b of the angular sensor 104, and is configured to transmit a request signal 132. The third signal line IFZ may be connected between an angular position encoder 152a of the angular sensor 104 and an angular position decoder 152b of the controller 114, and is configured to transmit an angular position signal 122. The third signal line IFZ may be also connected between a sensor condition encoder 154a of the angular sensor 104 and a sensor condition decoder 154b of the controller 114, and is configured to transmit a sensor condition signal 123. In some embodiments, the first, second and third signal lines IFA, IFB and IFZ may respectively have an impedance of about 50-200 ohms, which would be matched by termination resistances of the corresponding transceivers, and may also depend on the underlying communication interface and wiring to use.

The first and second plurality of incremental square pulses 128, 130, the zero-crossing pulse 136, the angular position signal 122, and the sensor condition signal 123 are generated and stored in the angular sensor 104 prior to the transmission. In some embodiments, the angular sensor 104 comprises a sensing module 106 comprising a plurality of sensing components, such as a magnetic field sensor 160, a temperature sensor 162, or stress sensor. For example, one or more permanent magnets may be attached to the physical entity 102, and the magnetic field resulting from the permanent magnets may be measured or sensed by one or more magnetic field sensors 160. Besides permanent magnets, electric magnets using coils with or without core for a magnetic field concentration can be used as well. The coils can physically rotate similar to permanent magnets or can be physically static, but generating a rotating magnetic field, as it is done in commutation of electric motors and drives. Magnetic field sensors include Hall sensors and sensors based on a magneto-resistive effect. Magneto-resistance denotes the property of a material or a multilayer device to change the value of its electrical resistance when an external magnetic field is applied to it. There are different materials and/or multilayer devices showing different types of magneto-resistance (short xMR), including Anisotropic Magneto Resistance (AMR), Giant Magneto-Resistance (GMR), Colossal Magneto-Resistance (CMR), Tunnel Magneto-Resistance (TMR), or Extraordinary Magneto-Resistance (EMR). Hall sensors use the property of the so-called Hall-effect, which is a voltage perpendicular to a current flow through a Hall probe, which is proportional to a magnetic flux density through the probe. Such Hall sensors can be implemented in lateral or vertical direction to the sensor die. Thus, the magnetic field sensors can be set up for 2D or for 3D configurations. A 2D configuration implements at least two sensors (e.g. sensors X 164 and Y 165), in case of a 3D configuration, at least three sensors (e.g. sensors X 164, Y 165, and Z 166) are implemented and two of the sensor probes can be selected using a selector 161 for a specific angular measurement. Alternatively, all sensors can be converted and the selection is done later on (or multiple angles can be calculated as well). For illustration purposes, a pair of Hall sensors X 164 and Y 165 is shown as an example of a positional sensor containing measurements of rotation activities of the physical entity 102 which generates the angular position signal 122 or a first raw sensing signal providing information about the motion of the physical entity 102, which is further processed into information such as speed, distance and position. A temperature sensor Temp 162 is shown as an example of a conditional sensor which generates the sensor condition signal 123 or a second raw sensing signal providing information of temperatures of the angular sensor 104. The first and second sensing signals are digital signals converted by analog-to-digital converters (ADCs) 168a-168c. ADCs can be of any type, there is no limitation to any specific converter architecture. A digital processor 110 is coupled to the sensing module 106 and configured to process and store the angular position signal 122 and the sensor condition signal 123. In some embodiments, the digital processor 110 may comprise a digital signal processor (DSP) or sequencer, which does error compensation of offset, offset temperature drift, amplitude synchronicity and orthogonality of the raw signals, and performs additional features such as auto-calibration, prediction and angle speed calculation if required for higher accuracies. The digital processor 110 may process the first sensing signal to the angular position signal 122 containing an absolute rotary position information by a coordinate rotation digital computer (CORDIC), which contains the trigonometric function for angle calculation. This triconometric functions can be implemented in the DSP as well. The absolute rotary position information can be then stored in a memory unit such as a random access memory (RAM), in result register comprising flip-flops (FFs) or similar digital storage elements. The digital processor 110 can be implemented more than one time or can be multiplexed in case of 3D setups to calculate more than one angle in parallel, which is then stored in the mentioned memory or register. The second sensing signal can also be processed and stored in the memory unit and transmitted to the controller 114 through the incremental interface 112 once the request signal 132 is received. The first and second plurality of incremental square pulses 128, 130 and the angular position signal 122 are processed by a processor 156 of the controller 114 to generate an absolute rotary signal, which will be further illustrated with reference to following FIG. 4 and FIG. 5.

Figure 4:
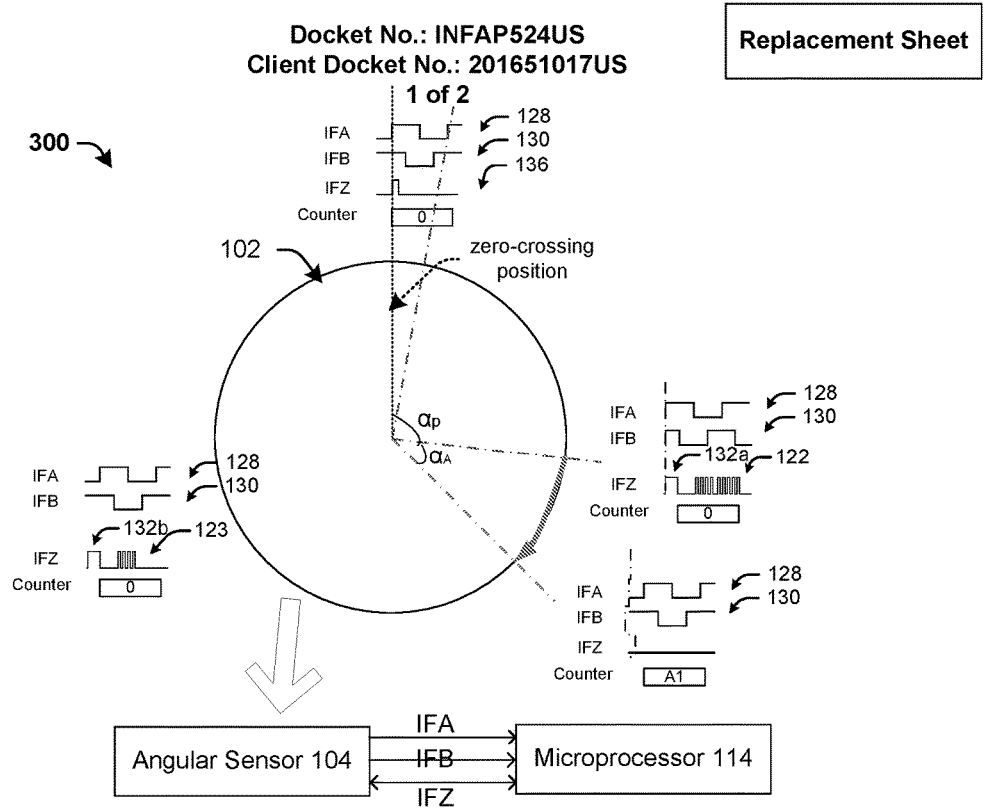
FIG. 4 shows sensing signals transmitted over signal lines in view of a rotation activity according to some embodiments.
Figure 5:
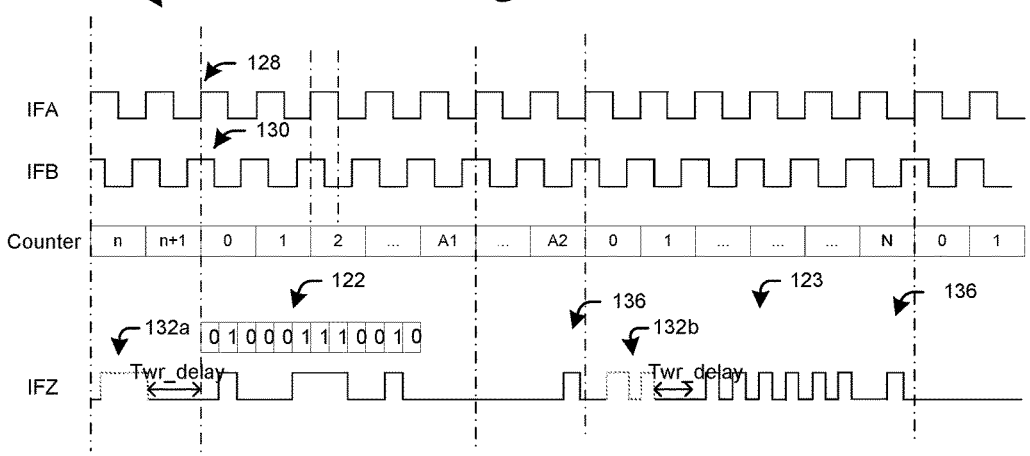
FIG. 5 shows a data transmission waveform diagram of the angular sensor system shown in FIG. 3 and FIG. 4 according to some embodiments.

With reference to FIG. 3, FIG. 4 shows sensing signals transmitted over signal lines in view of a rotation activity according to some embodiments. FIG. 5 shows a data transmission waveform diagram of the angular sensor system 300 shown in FIG. 3 according to some embodiments. An example is given assuming the physical entity 102 is located at a position with a rotary angle $\alpha_p$ and is rotating clockwise when turning on the angular sensor system 300 (shown by an arrow). The controller 114 sends a first request signal 132a to the angular sensor 104 requiring an angular position signal. At the same time, a counter of the first and second plurality of incremental square pulses 128, 130 is reset to zero. Upon receiving the request signal 132a, or after a short delay $T_{wr\_delay}$, the angular position signal 122 is transmitted from the angular sensor 104 to the controller 114. As shown in FIG. 5 for a detailed example, the angular position signal 122 may be a multi-bit binary signal. In the given example, the rotary angle $\alpha_p$ is 100° and the angular position signal 122 is 12 bits. A binary number corresponding to $100°/360°\times2^{12}$ is 010001110010. The binary number is transmitted using a suitable protocol, such as protocols listed above. During the transmission, the pulses of the first and second plurality of incremental square pulses 128, 130 continue to be counted until the angular position signal 122 finishes the transmission. In the given example, the counter counts A1 incremental pulses. Therefore, the displacement angle is calculated by A1/N×360°, where N is the resolution of the incremental interface 112. The phase shift between the first and second plurality of incremental square pulses 128, 130 indicates that the physical entity 102 rotates clockwise. The absolute rotary angle $\alpha_A$ can be calculated by $\alpha_p$+A1/N×360°. As the rotation continues, the physical entity 102 may rotate to a zero-crossing position, where the zero-crossing pulse 136 is generated, and the counter is reset from A2 (shown in FIG. 5) to zero. In some embodiments, a synchronic process can be performed. An absolute rotary angle calculated using the rotary angle signal, $\alpha_p$+A2/N×360° in the given example, is compared to the zero-crossing pulse indication. This comparison process can be used for further diagnostic checks, such as checking electromagnetic compatibility (EMC) influences. The comparison process may result generating additional request signals and positional signal readings if a comparison result exceed a pre-determined threshold level. Further, at any time of the rotation, the controller 114 may send a second request signal 132b to the angular sensor 104 requiring a sensor condition signal. Upon receiving the second request signal 132b, or after a short delay $T_{wr\_delay}$, the sensor condition signal 123 is encoded and transmitted from the angular sensor 104 to the controller 114, which may be decoded by the controller 114 and processed for further determination. As shown, bits are coded with single pulses, but can be also modulated with more than one current or voltage level or with encoding schemes like Manchester codes. In some embodiments, the information can include integrity checks as parity or CRC information additionally to the transmitted angular data. Transmitted data can also contain additional information such as internal voltages, temperature or stress, a configuration request or a sensor diagnosis request (build-in self-test). It is important to mention, that this request protocol 132a, 132b and response protocol 122, 123 can be exchanged by any serial or parallel protocol. Preferably, bidirectional interfaces with low pin and wiring counts will be used like UART, SPI, SPC, 120 or similar. The selection will also be determined by the requirement of wiring length and transmission speeds (determining the maximum rotation of the magnetic field to reliably transmit). The proposed protocol inherits the property of backward-compatibility to the standard incremental interface, if required.

It shall be mentioned that this bidirectional transmission is not limited to pure angular information. Some embodiments can additionally transmit status information of the sensor, diagnosis information like results of self-tests or internal/external circuit states or even reconfigure sensor properties like (but not limited to) sensitivity or resolution settings. Furthermore, embodiments can use additional signal lines to control the direction of the communication, synchronize the transmission using a serial clock (as done e.g. with SPI interfaces) or transmit the binary data from the sensor to the receiver in a parallel fashion.

Figure 6:
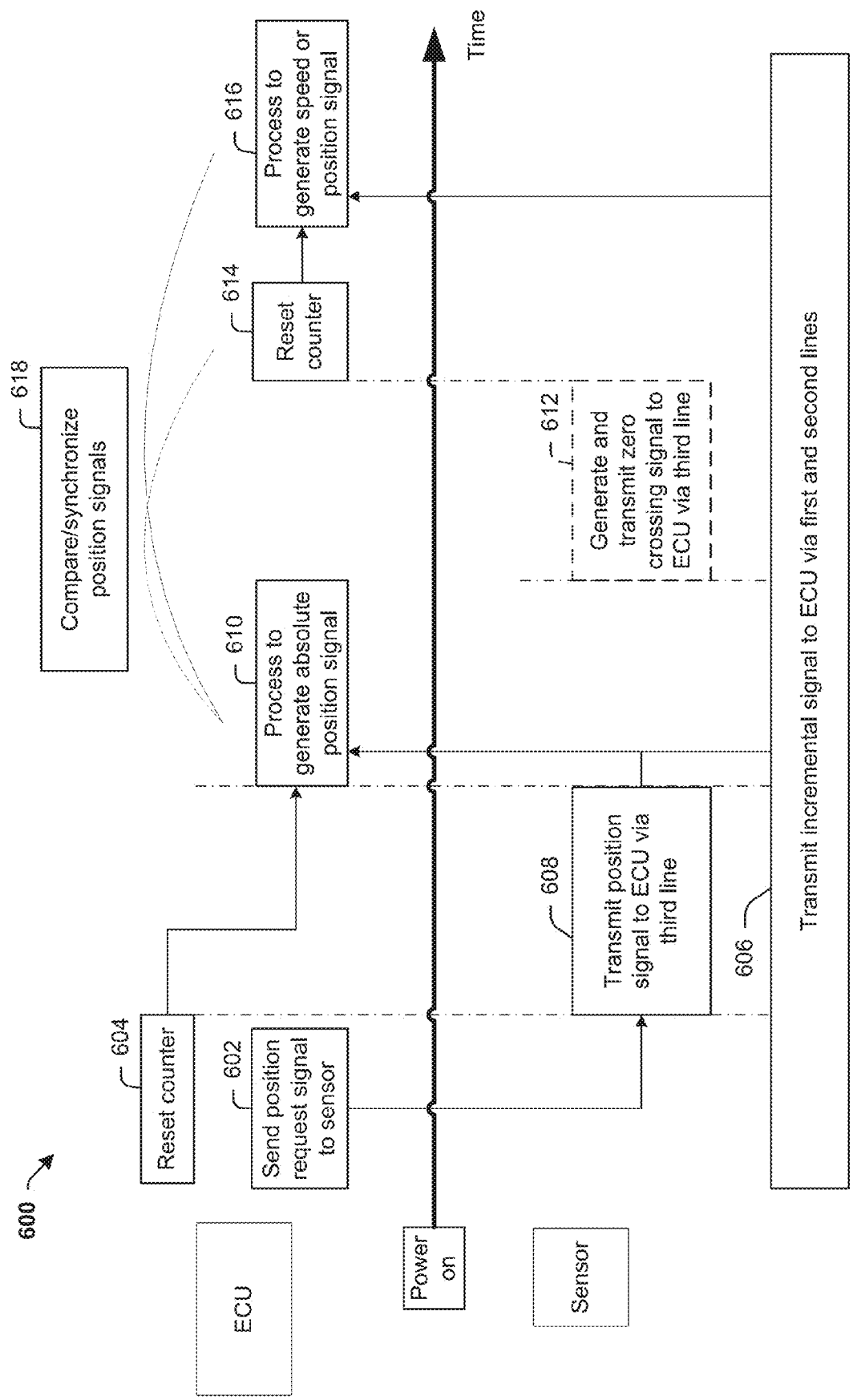
FIG. 6 shows a flow diagram illustrating a method of operating an angular sensor system including a true-power-on incremental interface according to some embodiments.

FIG. 6 shows a flow diagram 600 illustrating a method of operating an angular sensor system including a true-power-on incremental interface according to some embodiments. It is appreciated that though the flow diagram 600 is illustrated along a time line, some operating steps may happen in a different order or with a timing shift different from what is shown in FIG. 6. For example, a zero-crossing pulse may be generated prior to, during, or after transmitting an incremental position signal, depending on when a 'zero-crossing position' is crossed. Also, a sensor condition signal may be requested and transmitted any time during the operation, in order to check working condition of the angular sensor.

The flow diagram 600 starts from a block 602, where a position request signal is sent from an electronic control unit (ECU) to a sensor device.

At block 604, a counter within the ECU is reset. In some embodiments, the counter is reset once the position request signal is sent out.

At block 606, incremental signals are transmitted from the sensor device to the ECU over first and second signal lines. In some embodiments, the incremental signals are square pulses correlated to angular displacement steps of the angular sensor.

At block 608, a position signal is transmitted to ECU over a third signal line according to a bidirectional protocol.

At block 610, the incremental signal and the position signal are processed to generate a first absolute position signal.

At block 612, a zero-crossing pulse is generated and transmitted from the sensor device to the ECU when a 'zero-crossing position' is crossed. In some embodiments, the zero-crossing pulse is a single pulse, or a series of pulses.

At block 614, the counter within the ECU is reset when receiving the zero-crossing pulse.

At block 616, the incremental signal and the zero-crossing pulse are processed to generate a second absolute position signal.

At block 618, the first absolute position signal can be compared and checked when the zero-crossing pulse is received. The first absolute position signal can also be compared to the second absolute position signal after the second absolute position signal is received. The comparison process may result generating additional request signals and positional signal readings if a comparison result exceed a pre-determined threshold level. For example, an absolute angle request signal may be sent out to the incremental interface when an offset of the absolute rotary angle signal exceeds a threshold level. In some embodiments, a diagnostic request signal can be sent out anytime. In response to the diagnostic request signal, a sensor condition signal can be sent out through the bidirectional signal line.

Figure 7:
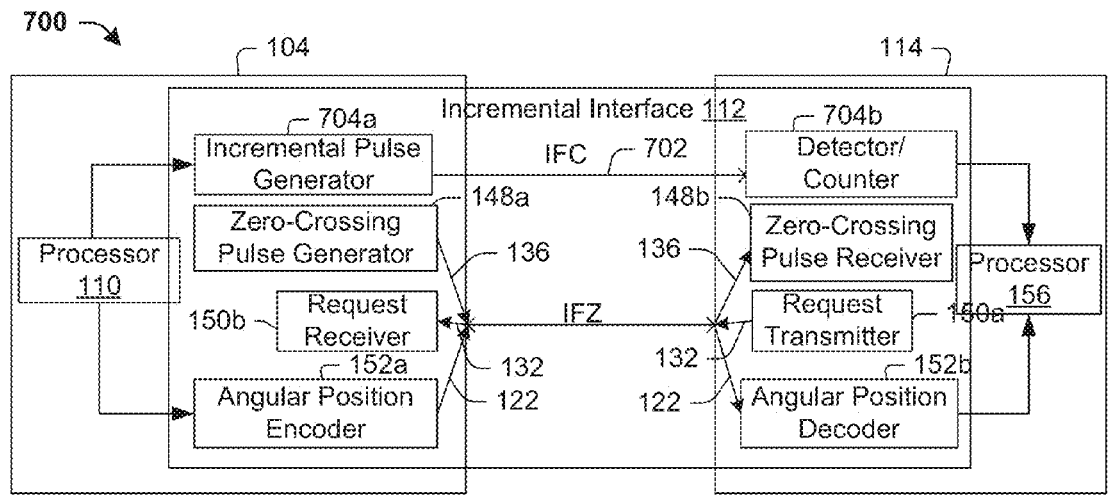
FIG. 7 shows a block diagram illustrating an angular sensor system including a true-power-on incremental interface according to some other embodiments.
Figure 8:
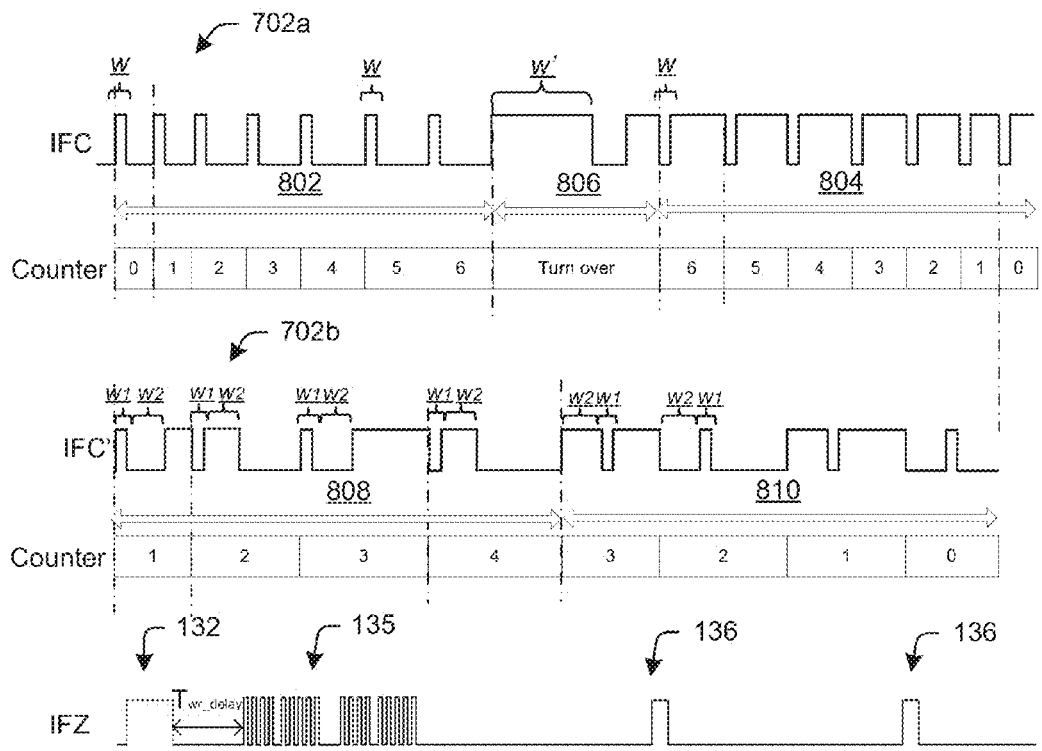
FIG. 8 shows sensing signals transmitted over signal lines in view of a rotation activity according to some embodiments.

FIG. 7 shows a block diagram illustrating an angular sensor system 700 including a true-power-on incremental interface for angular sensors according to some embodiments. FIG. 8 shows sensing signals of the angular sensor system 700 of FIG. 7 transmitted over signal lines in view of a rotation activity according to some embodiments. As shown in FIG. 7, the angular sensor system 700 comprises an incremental interface 112 including a unidirectional signal line IFC and a bidirectional signal line IFZ and extending between an angular sensor 104 and a controller 114. The unidirectional signal line IFC is connected to an incremental pulse generator 704a of the angular sensor 104 and an incremental pulse detector 704b of the controller 114. The unidirectional signal line IFC is configured to transmit a plurality of incremental pulses 702 from the incremental pulse generator 704a to the incremental pulse detector 704b. The plurality of incremental pulses 702 indicates rotary information such as rotary speed, direction.

FIG. 8 shows examples of the incremental pulses 702 that are used to transmit incremental rotary information. As shown in a top part of the FIG. 8, in some embodiments, a first kind of incremental signal 702a includes square pulses with a pre-determined pulse width that correlate to the "pulse count" of the incremental interface 112. A voltage level of the square pulses indicates a rotation direction, i.e., a high voltage square pulse as shown in a first part 802 of the first kind of incremental signal 702a indicates the rotation towards a first direction (e.g. a clockwise direction), and a low voltage square pulse as shown in a second part 804 of the first kind of incremental signal 702a indicates the rotation towards a second direction opposite to the first direction (e.g. an anticlockwise direction). A redundant pulse 806 may be generated during a turn over point of the directions. Each of the pulses is detected or counted and interpreted as one rotary angle unit. For interpretation purpose, similar as FIG. 2, FIG. 8 shows example situations where the rotation to be measured happens at the first direction with a decreasing speed and then turns over to the second direction opposite to the first direction with an increasing speed. The pulse width w is pre-determined and an interval between pulses indicates the speed of the rotation. A longer pulse width w' would be detected for the redundant pulse at the turn over point of the directions. As shown in a bottom part of the FIG. 8, in some other embodiments, a second kind of incremental signal 702b includes square pulses with modulated widths, for example, a pair of pulses with a relative shorter pulse width w1 and a relative longer pulse width w2. The order of shorter and longer pulses indicates the direction of the rotation. For example, the longer pulse w2 following the shorter pulse w1 indicates the rotation towards a clockwise direction as shown in a first part 808, and the shorter pulse w1 following the longer pulse w2 indicates the rotation towards an anti-clockwise direction as shown in a second part 810. The pulse widths w1, w2 are pre-determined and an interval between the pairs of the pulses indicates the speed of the rotation. Notably, besides pulses with high or low signal level, or pulses pairs with short and long pulses width, other suitable pulse width modulation (PWM) nibbles may be utilized to indicate rotation directions, such that the wiring count is further reduced. The purpose of this method is to reduce the wiring count further.

Referring back to FIG. 7, the bidirectional signal line IFZ is connected to a zero-crossing pulse generator 148a, request receiver 150b, and an angular position encoder 152a of the angular sensor 104 and a zero-crossing pulse receiver 148b, a request transmitter 150a and an angular position decoder 152b of the controller 114. Similar to the third signal line IFZ shown and described in FIG. 2 or FIG. 5, the bidirectional signal line IFZ transmits a request signal 132 from the request transmitter 150a to the request receiver 150b. In responding to the request signal 132, the bidirectional signal line IFZ transmits a status signal 135 from the angular position encoder 152a to the angular position decoder 152b to indicate absolute rotary angle information. In some embodiments, the status signal 135 is encoded as a multi-bit binary signal. The status signal 135 may alternatively include a sensor condition signal indicating conditions of the sensor device, such as temperature or stress. Whenever the sensor device detects a pre-determined 'zero-crossing position' being crossed, the bidirectional signal line IFZ transmits a zero-crossing pulse 136 to reset the incremental pulse detector 704b. By incorporating transmission of the incremental rotary information into one unidirectional signal line IFC, and incorporating transmissions of the absolute rotary angle information, the sensor condition information, and the zero-crossing indication information into one bidirectional signal line IFZ, more compact transmission is realized and the amount of pins needed for a sensor package is decreased.

Figure 9:
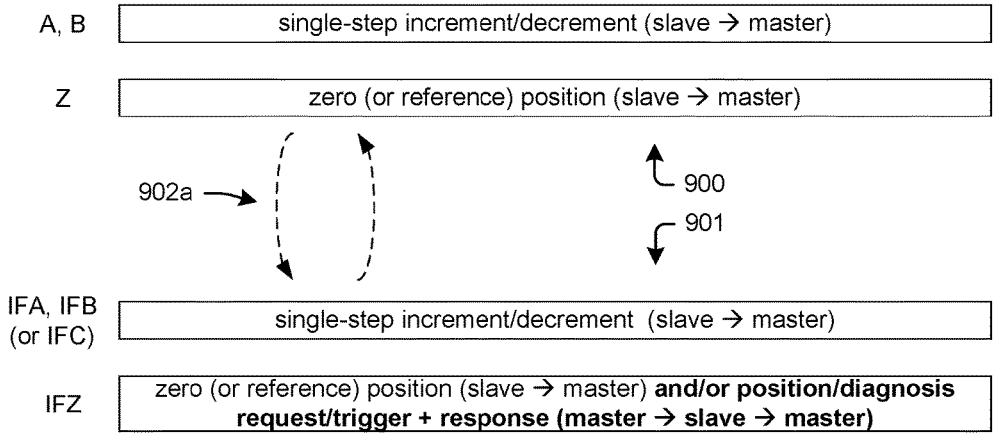
FIG. 9 shows an abstract overview based on channels of the transition of an enhanced incremental interface with additional capabilities.
Figure 10:
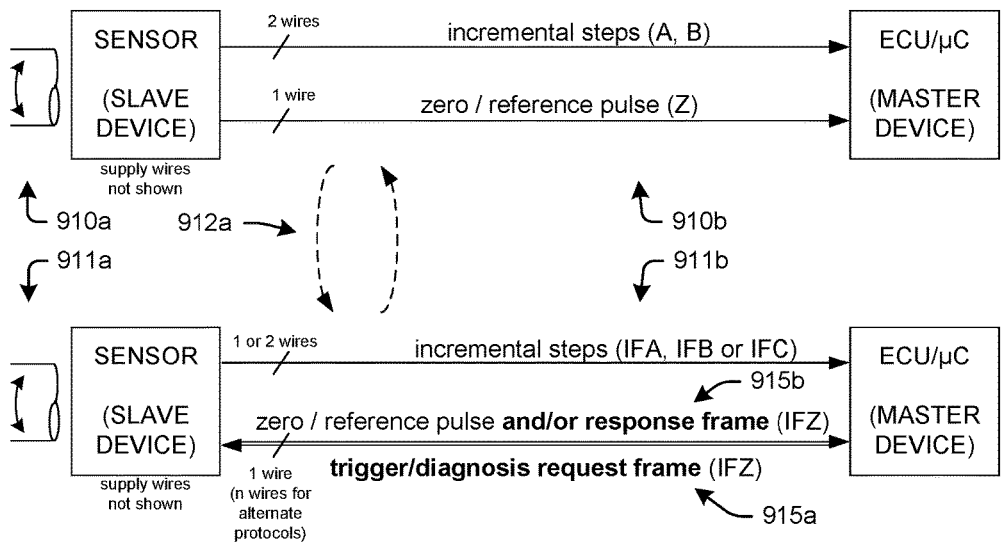
FIG. 10 shows the simplified wiring setup (omitting supply lines and other common wiring) between sensor or slave device and a microcontroller or master device of an enhanced incremental interface with additional capabilities.

FIG. 9 consolidates the transition 902a from the standard, incremental interface 900 using an incremental information channel and the zero (or reference) point indication channel to the improved interface 901. In some embodiments, the improved interface reduces the wiring effort of the incremental information channel, in other embodiments it uses the zero (or reference) point indication channel to allow a bidirectional request/response communication mechanism initiated by the master. This bidirectional transmission can be based on any interface capable to do so (as, but not limited to, the previously explained protocol or use SPC, PSI5, 1-wire, i2c, SPI and so forth as alternative). Other embodiments can also request diagnosis information from the sensor (like internal diagnosis measurements) on the same interface line. Further embodiments can combine one or more of these mechanisms in one setup or add additional wiring to transmit this information in parallel (by adding more than one IFZ wire) or allow also a request to be initiated by the sensor (for example to flag an erroneous condition of the sensor before the master has to initiate a new diagnosis cycle). Some FIG. 10 illustrates a transition 912a on physical level, from the standard interface setup 910b transmitting the rotational information 910a to the improved interfacing 911b to determine the actual angle position 911a without waiting for the rotation to the next zero (or reference) point of the mechanical system. Embodiments can reduce wiring accordingly or add wires for any protocol standard allowing bidirectional data communication, with preferences to low wiring count due to cost reasons and the potential fall-back option to a standard incremental interface. This bidirectional communication is initiated by a trigger or request frame 915a from the master device, for which the sensor returns a response frame 915b. Nevertheless, in other embodiments the sensor may also send response frames 915b without the need for a request or trigger frame 915a to signal emergency or error conditions in between, beside sending the zero or reference pulse as compatible fall back to the standard incremental protocol.

Figure 11:
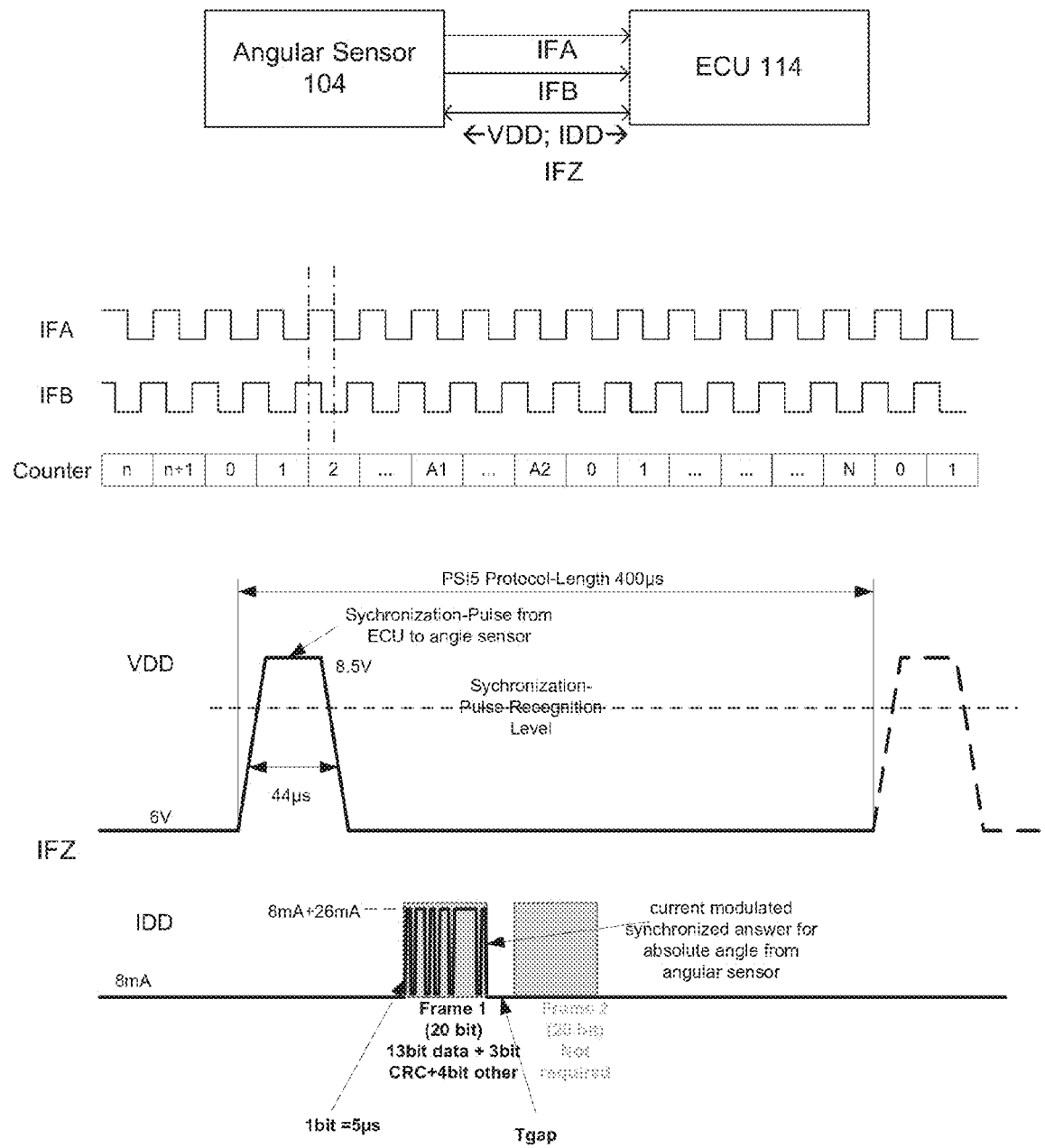
FIG. 11 shows a sensing signal synchronization and transformation protocol according to some embodiments.

FIG. 11 shows a sensing signal synchronization and transformation protocol according to some embodiments. As shown in FIG. 11, a pair of unidirectional signal lines IFA, IFB transmits incremental signals from an angular sensor 104 to a controller 114. The incremental signals correlate to the "pulse count" of the incremental interface that are counted (by a counter) and interpreted as rotary angle displacements. In some embodiments, the signal lines A and B are offset from each other by a phase difference to indicate a direction of the rotation. A bidirectional signal line IFZ transmits a synchronization request signal and an absolute angle information via a Peripheral Sensor Interface 5 (PSI5) Interface. The absolute angle information may be generated by an absolute angle sensor without using the incremental signals and can be stored in the angular sensor. In this way, the incremental signals provide a fast update of the rotary angle displacements. Once the synchronization request signal is received, the absolute angle information can be processed together with the incremental signals to provide an absolute position update in real-time or at least prior to reaching a reference position. The synchronization request signal may be transmitted from the controller 114 to the angular sensor 104 by a voltage modulation (shown as VDD). As an example, the VDD modulation has a time frame (e.g. 400 μs) for the synchronization pulse transmission. The synchronization pulse is recognized if the detected voltage is modulated to be greater than a synchronization pulse recognition level and the pulse width falls in a predetermined range. The absolute angle information may be transmitted in response to the synchronization request signal from the angular sensor 104 to the controller 114 by a current modulation (shown as IDD). The IDD modulation also has a time frame (e.g. 100 μs) for each of transmission data frames that includes multiple bits (e.g. 20 bits) and a time slot (e.g. 5 μs) for each bit of the transmission frame. Multiple transmission data frames could be used to transmit the absolute angle information. The transmission data frames are sent periodically from the angular sensor 104 to the controller 114. A minimum gap time Tgap is required between two transmission data frames. Each PSI5 data frame may consist of a number of bits including data bits, cyclic redundancy check (CRC) bits and other bits.

Figure 12:
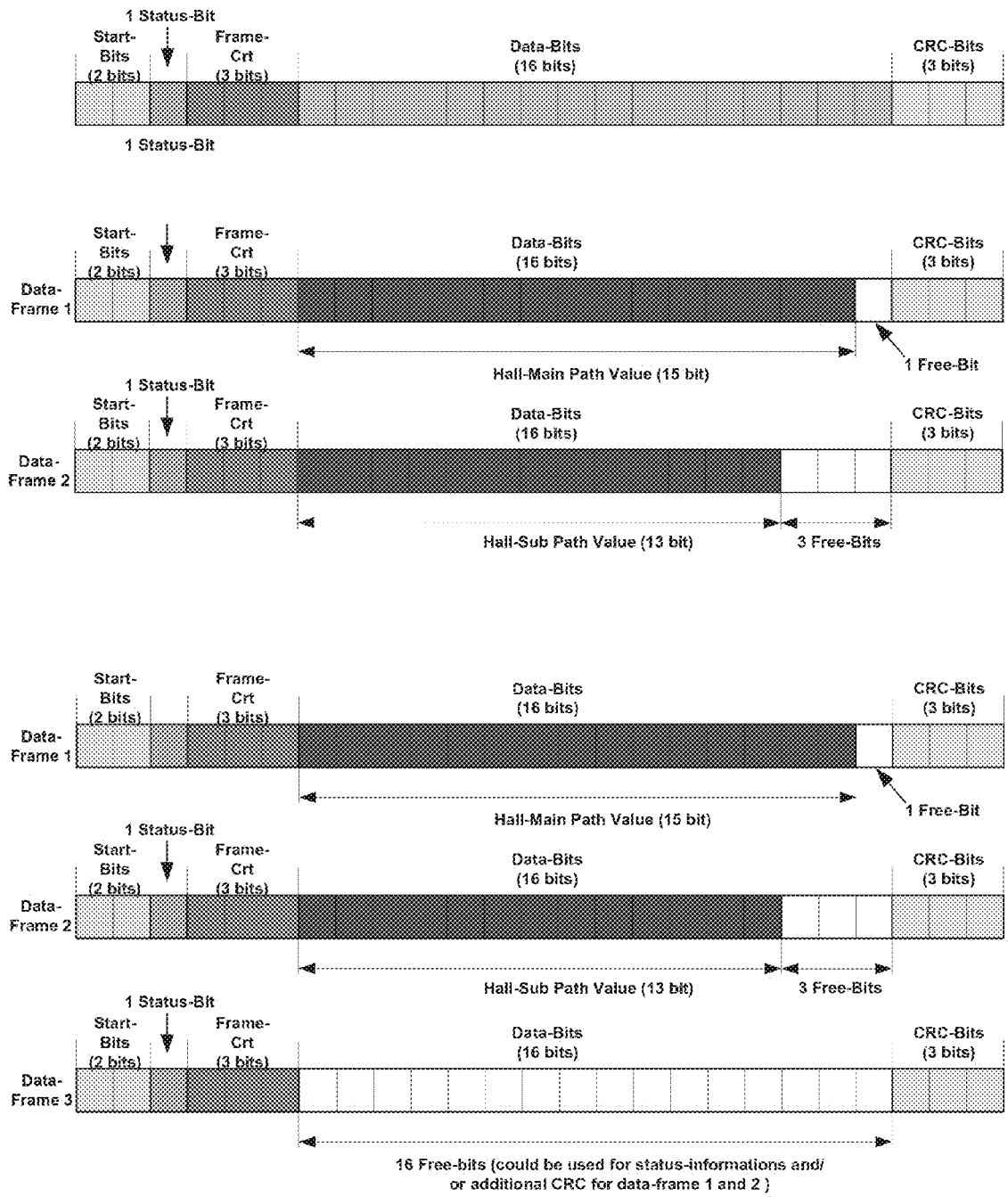
FIG. 12 shows a data transfer example of FIG. 11 according to some embodiments.
Figure 13:
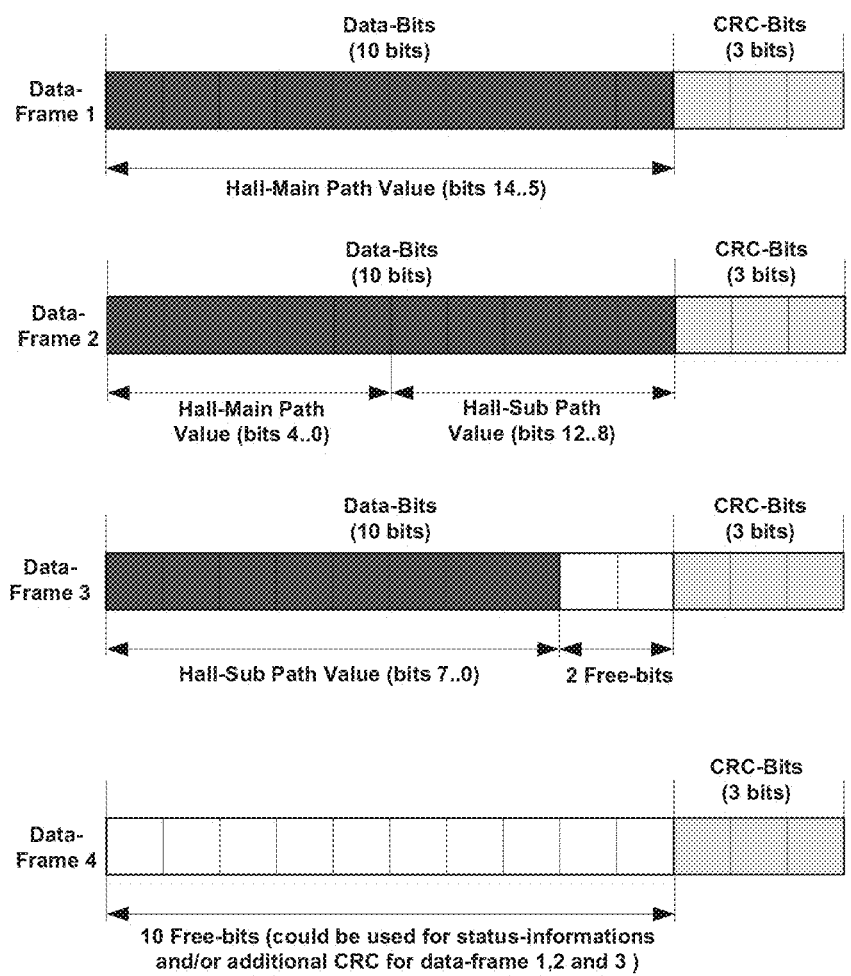
FIG. 13 shows an alternative data transfer example of FIG. 11 according to some embodiments.

FIG. 12 and FIG. 13 respectively show some transmission data frame examples of FIG. 11 according to some embodiments. As shown in FIG. 12 and FIG. 13, each of the data frames of the transmitted absolute angle information may consist of the following bits: start bits (e.g. two bits that are always coded as "0"), status bits ((optional 0, 1 or 2 bits, indicate sensor status), frame control bits ((optional 0, 1, 2, 3 or 4 bits, indicate type of frame or data content, or identifies the sensor), data region (e.g. 10-24 bits, indicate absolute location information), and CRC bits (e.g. 3 bits for cyclic redundancy check for error detection). In some instances, during Initialization with a data range method, multiple data frames are used to transmit one absolute position information, and one or more remaining bits of the data regions of these frames can be set as free bits that could be used for status information and/or additional CRC for check. FIG. 12 shows an example where a first data frame is used to transmit 15 bits of a Hall main path value and to leave 1 free bit, and a second data frame is used to transmit 13 bits of a Hall sub path value and to leave 3 free bits. As an alternative embodiment, a third data frame can be arranged to have the whole 16 data bits as free bits for status information and/or additional CRC check for the first data frame and the second data frame. As an example to transmit an absolute position information being consistent with FIG. 12, FIG. 13 shows an example where a first data frame is used to transmit the first 10 bits of the Hall main path value of FIG. 12, a second data frame is used to transmit the remaining 5 bits of the Hall main path value and the first 5 bits of the Hall sub path value, and a third data frame is used to transmit the remaining 8 bits of the Hall sub path value and to leave 2 free bits. A fourth data frame can be arranged to have the whole 10 data bits as free bits for status information and/or additional CRC check for the first, second and third data frames. Each of the first, second, third and fourth data frames has three CRC bits for error checking.

It is appreciated that the above methods and variations thereof can be combined and utilized interchangeably. The claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of system that may be used to implement methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

An angular sensor comprises a sensing module configured to generate a sensing signal containing measurements of rotation activities of a rotating physical entity or conditions of the angular sensor and a digital processor configured to process and store the sensing signal. The angular sensor further comprises an incremental interface coupled to the digital processor and comprising an incremental pulse generator and a status data encoder. The incremental pulse generator is configured to convert and transmit the sensing signal as incremental square pulses through a unidirectional signal line. The incremental square pulses are received by an incremental pulse receiver and processed to generate rotary angle and direction of the physical entity. The status data encoder is configured to convert and transmit the sensing signal as a zero-crossing pulse and a status signal through a bidirectional signal line. The status signal is received by a status data decoder and processed to generate an angular position signal or a sensor condition signal.

An angular sensor system comprises a sensing module configured to generate a raw rotary signal containing measurements of rotary speed and position of a rotating physical entity and an analog-to-digital converter (ADC) configured to receive the raw rotary signal and convert to a digital rotary signal. The angular sensor system further comprises a digital processor configured to process and store the digital rotary signal and an incremental interface coupled to the digital processor and configured to convert and transmit incremental signals from the sensing module through a first unidirectional signal line and a second unidirectional signal line, and receive a request signal and transmit an angular position signal and a zero-crossing pulse through a bidirectional signal line. The angular sensor system further comprises a controller coupled to the incremental interface through the first and second unidirectional signal lines and the bidirectional signal line to send the request signal and to receive and process the incremental signals and the angular position signal to generate an absolute rotary angle signal.

An angular sensor comprises a sensing module configured to generate a rotary signal containing measurements of rotary speed and position of a rotating physical entity and an incremental interface coupled to the sensing module and configured to transmit incremental signals through a first unidirectional signal line and a second unidirectional signal line from the sensing module to a counter of a controller, and transmit an angular position signal and a zero-crossing pulse through a bidirectional signal line. The incremental interface is configured to transmit the angular position signal once receiving a request signal via the bidirectional signal line.

An angular sensor comprises a sensing module configured to generate a rotary signal containing measurements of rotary speed and position of a rotating physical entity and an incremental interface coupled to the sensing module and configured to transmit an incremental signals through one single unidirectional signal line from an encoder of the sensing module to a detector of a controller, and transmit an angular position signal and a zero-crossing pulse through one single bidirectional signal line to the controller. The controller is configured to receive and process the incremental signal and the angular position signal or the zero-crossing pulse to generate an absolute rotary angle signal.

A method of operating an angular sensor comprises sending an absolute angle request signal to the angular sensor through a bidirectional signal line of an incremental interface of the angular sensor. The method further comprises transmitting an angular position signal through the bidirectional signal line of the incremental interface and transmitting incremental signals including square pulses per angle step with a quantized step size and a 90° phase shift through a first unidirectional signal line and a second unidirectional signal line respectively upon receiving the absolute angle request signal. The method further comprises processing the angular position signal and the incremental signals to generate an absolute rotary angle signal before a zero-crossing pulse is detected.

What is claimed is:

1. An angular sensor comprising:
a sensing module configured to generate a sensing signal containing measurements of rotation activities or one or more dimensions of a rotating physical entity, or conditions of the angular sensor;
a circuit to process and store the sensing signal;
an incremental interface comprising an incremental pulse generator on a unidirectional transmission channel, and a reference pulse transmitter and a data encoder on a bidirectional transmission channel;
wherein the incremental interface is configured to convert and transmit incremental changes of the sensing signal as pulses through one or more signal lines, and the pulses are received by an incremental pulse receiver and processed to generate angle and direction changes of the physical entity;
wherein the reference pulse transmitter is configured to transmit a reference pulse through a signal line at a predefined angular position, to allow the incremental pulse receiver to determine a reference position from which the incremental changes are processed in the incremental pulse receiver to generate an absolute angle position, and the data encoder is configured to transmit a data requested by the receiver at an arbitrary time point through one or more signal lines.

2. The angular sensor of claim 1, wherein the data requested by the sensor and processed by the receiver is an absolute angular position signal, an relative angular position signal, a sensor condition, a sensor configuration, or an arbitrary sensor diagnosis result from a build-in self-test.

3. An angular sensor system comprising:
a sensing module configured to generate a raw rotary signal containing measurements of rotary speed and position of a rotating physical entity and other physical conditions;
one or more analog-to-digital converter (ADC) configured to receive the raw rotary signal and other physical conditions and convert to a digital rotary signal and optional digital condition signals;
a digital processor configured to process and store the digital rotary signal and optional digital condition signals;
an incremental interface coupled to the digital processor and configured to convert and transmit incremental signals from the sensing module comprising two unidirectional signal lines and a bidirectional signal line;
wherein the incremental signals are encoded as angular steps by pulses and a direction of the angular steps by a phase shift between the incremental signals and transmitted through the two unidirectional signal lines;
wherein the bidirectional signal line is configured to transmit a reference pulse to determine an absolute angular position in relation to the incremental interface and to receive a request signal initiating the transmission of an angular position signal; and
a controller coupled to the incremental interface through the two unidirectional signal lines to process the incremental signals to determine relative angular changes and the bidirectional signal line to retrieve either a reference pulse or to request and receive an angular position, sensor condition, sensor status, sensor configuration or sensor self-test.

4. The angular sensor system of claim 3, wherein the absolute rotary angle signal is requested and generated prior to receiving the reference pulse.

5. The angular sensor system of claim 3, wherein the incremental signals determining the increments and direction of the angular signal are combined by PWM-coded signals to a single unidirectional line.

6. The angular sensor system of claim 3, wherein the requested and retrieved information on the bidirectional signal line comprises a binary number processed and stored in the digital processor, wherein the binary number is transmitted through a multi-bit binary signal in responding to the request signal from the controller in a serial or parallel transmission with zero or more additional signal and control lines.

7. The angular sensor system of claim 3, wherein the request signal comprises a single pulse.

8. The angular sensor system of claim 3, wherein the request signal comprises a request of sensor status request signal including internal voltages, temperature or stress, a configuration request or a sensor diagnosis request.

9. The angular sensor system of claim 3, wherein the request signal is sent out to the incremental interface via the bidirectional signal line when the angular sensor system is turned on.

10. The angular sensor system of claim 3, wherein the bidirectional signal line transmit data to and from the controller according to a communication protocol employing short pulse width modulation code (SPC), universal asynchronous receiver/transmitter (UART), peripheral sensor interface (PSI), with additional control lines employing serial peripheral interface (SPI) and inter-integrated circuit interface (I2C) and distributed systems interface (DSI) for data encoding.

11. An angular sensor comprising:
a sensing module configured to generate a rotary signal containing measurements of rotary speed and position of a rotating physical entity; and
an incremental interface coupled to the sensing module and configured to transmit incremental signals through a first unidirectional signal line and a second unidirectional signal line from the sensing module to a counter of a controller, and transmit an angular position signal and a reference pulse through a bidirectional signal line;
wherein the incremental interface is configured to transmit the angular position signal once an angular position request signal is received via the bidirectional signal line.

12. The angular sensor of claim 11, wherein the first unidirectional signal line and the second unidirectional signal line are configured to transmit the incremental signals including square pulses per angle step with a quantized step size and a phase shift between the first unidirectional signal line and the second unidirectional signal line.

13. The angular sensor of claim 11, wherein the bidirectional signal line is configured to transmits the reference pulse from the incremental interface to the controller once a reference position is detected.

14. The angular sensor of claim 11, wherein the controller is configured to receive and process the incremental signals and the angular position signal to generate an absolute rotary angle signal.

15. The angular sensor of claim 11, wherein the controller is configured to set a counter to a reference value of the controller once sending the request signal.

16. The angular sensor of claim 11, wherein the angular position signal received from the bidirectional signal line is utilized to offset the incremental signals received from the first and second unidirectional signal lines to generate an absolute rotary angle signal before the reference pulse is generated.

17. The angular sensor of claim 16, wherein the absolute rotary angle signal is checked when the reference pulse is received, and wherein an absolute angle request signal is sent out to the incremental interface when an offset of the absolute rotary angle signal exceeds a threshold level.

18. The angular sensor of claim 11, wherein the bidirectional signal line transmits a sensor condition signal from the incremental interface to the controller.

19. An angular sensor comprising:
a sensing module configured to generate a rotary signal containing measurements of rotary speed and position of a rotating physical entity; and
an incremental interface coupled to the sensing module and configured to transmit an incremental signals through one single unidirectional signal line from an encoder of the sensing module to a detector of a controller, and transmit an angular position signal and a reference pulse through one single bidirectional signal line to the controller;
wherein the controller is configured to receive and process the incremental signal and the angular position signal or the reference pulse to generate an absolute rotary angle signal.

20. The angular sensor of claim 19, wherein the incremental interface is configured to transmit incremental signals including pairs of a short pulse and a long pulse.

21. A method of operating an angular sensor, the method comprising:
sending an absolute angle request signal to the angular sensor through a bidirectional signal line of an incremental interface of the angular sensor;
upon receiving the absolute angle request signal, transmitting an angular position signal through the bidirectional signal line of the incremental interface and transmitting incremental signals including square pulses per angle step with a quantized step size and a 90° phase shift through a first unidirectional signal line and a second unidirectional signal line respectively;
processing the angular position signal and the incremental signals to generate an absolute rotary angle signal before a zero-crossing pulse is detected.

22. The method of claim 21, further comprising checking the absolute rotary angle signal when the zero-crossing pulse is received and sending out another absolute angle request signal to the incremental interface when an offset of the absolute rotary angle signal exceeds a threshold level.

23. The method of claim 21, further comprising sending a diagnostic request signal to the angular sensor through the bidirectional signal line of an incremental interface of the angular sensor and transmitting a zero-crossing pulse through the bidirectional signal line.

24. The method of claim 21, further comprising transmitting a diagnostic signal through the bidirectional signal line.

25. The method of claim 21, further comprising determining a rotational speed of the angular sensor by processing the incremental signals received through the first unidirectional signal line and the second unidirectional signal line.

* * * * *